12) United States Patent
Reinhardt

(10) Patent No.: US 6,754,476 B1
(45) Date of Patent: Jun. 22, 2004

(54) TRANSPORTABLE RADIO TRANSMITTER, ESPECIALLY A REMOTE

(75) Inventor: Matthias Reinhardt, Winnenden (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/503,150

(22) Filed: Feb. 11, 2000

(30) Foreign Application Priority Data

Feb. 11, 1999 (DE) .......................................... 199 05 635

(51) Int. Cl.[7] .............................................. H04B 1/04
(52) U.S. Cl. ...................... 455/127.1; 455/126; 330/285
(58) Field of Search ............................. 455/127, 126, 455/118, 127.1, 127.2, 127.3, 127.4, 127.5; 330/285, 129, 140

(56) References Cited

U.S. PATENT DOCUMENTS

| 5,367,268 A | * | 11/1994 | Baba ........................... 330/129 |
| 5,423,081 A | | 6/1995 | Thiele et al. |
| 5,764,106 A | * | 6/1998 | Deen et al. .................. 330/279 |
| 6,442,378 B1 | * | 8/2002 | Aboukhalil et al. ...... 455/115.3 |

FOREIGN PATENT DOCUMENTS

| DE | 43 39 526 A1 | 11/1993 |
| EP | 0 654 900 | 5/1995 |
| EP | 0 775 792 | 5/1997 |
| JP | 56-344409 | 8/1981 |
| JP | 1317098 | 12/1989 |
| JP | 5076211 | 3/1993 |
| JP | 05-191299 | 7/1993 |
| JP | 8509589 | 10/1996 |
| JP | 09-148945 | 6/1997 |
| JP | 10-145160 | 5/1998 |
| JP | 10-303668 | 11/1998 |

OTHER PUBLICATIONS

Japanese Office action with English translation

* cited by examiner

Primary Examiner—Vivian Chin
Assistant Examiner—Raymond B. Persino
(74) Attorney, Agent, or Firm—Crowell & Moring LLP

(57) ABSTRACT

A portable radio transmitter, especially a remote for a motor vehicle, has a voltage generator for generating an alternating voltage signal, a power-regulatable amplifier stage for amplifying the alternating voltage signal, and a power-regulating circuit with an operational amplifier. One input of the operational amplifier is supplied with a power setting voltage and other input is supplied through a rectifier stage with a feedback voltage signal. A transmitting antenna is supplied by the amplified alternating-voltage signal. The voltage signal generator includes an oscillator and the amplifier stage contains at least one bipolar transistor with its base connected to the oscillator, in whose collector-emitter current path a current adjustment element, controlled by the operational output, is wired. The rectifier stage includes a pair of diodes connected in parallel and in opposite directions and a capacitor and a resistor that are connected in parallel with one of the diodes.

13 Claims, 3 Drawing Sheets

TRANSPORTABLE RADIO TRANSMITTER, ESPECIALLY A REMOTE

BACKGROUND AND SUMMARY OF THE INVENTION

The invention relates to a portable radio transmitter especially suited as a remote for a motor vehicle. Electronic keys are being used increasingly instead of mechanical keys for modern automobiles as device which authorize access and/or use. In the special case of remotes, the encoded information authorizing access and/or use is transmitted to the vehicle. Conventional remotes use an oscillator as a voltage signal source acting in conjunction with the antenna. However, this can result in relatively large scatter of the transmitting power of the remote, typically up to 6 dB and, with temperature drift, up to approximately 9 dB, so that a one-third reduction of the original desired range may occur.

A mobile radio transmitter, in other words, a handheld transmitter or cell phone, is known from German Patent Document DE 43 39 526 A1. In this handheld radio, the AC voltage signal generated by a voltage signal generator, consisting of a high-frequency carrier signal with a time-compressed modulated speech signal, is supplied to a power-controllable HF driver amplifier. The output signal is supplied to an HF power end stage with constant power amplification, whose output signal, in turn, is supplied through an HF output filter to an antenna. Additionally, the output signal from the HF driver amplifier is supplied through an isolating amplifier to an HF rectifier stage. The isolating amplifier delivers an output signal proportional to the HF power. In the rectifier stage, the amplifier output signal is guided through a coupling capacitor to the cathode side of an HF rectifier diode, which is grounded, on the anode side, through another capacitor, and is also supplied through an HF choke with a reference voltage that functions as the DC bias. A parallel, identically structured diode branch provides DC bias compensation in the rectifier stage, whose output voltage on the cathode side is subtracted from the voltage of the rectifier diode in a summing amplifier. Thus the summing amplifier delivers only the rectified HF voltage on the output side. This summing amplifier output signal is supplied to the inverting input of an operational amplifier. The non-inverting input of the operational amplifier is supplied with a power setpoint voltage representing the desired output power. The output signal of the amplifier serves as the control voltage for adjusting the power of the HF driver amplifier.

The present invention provides a portable remote radio transmitter, which has a simple compact design, and which has no undesirable fluctuations in the radiated transmitting power. The radio transmitter includes an oscillator as the voltage signal generator with the power-regulating amplifier stage containing at least one bipolar transistor having its base electrode connected to the oscillator. A current-adjusting element is looped in the collector-emitter current path and is controlled by an adjustment signal from the operational amplifier. The rectifier stage has diodes connected in parallel, in opposite directions, and one resistor and one capacitor wired in parallel to one of the diode at the corresponding operational amplifier input.

With this arrangement, transmitting power can be regulated so that undesired transmitting power fluctuations can be prevented. If the power setpoint voltage is adjustable, the radio transmitting power can be varied, as needed. Because of its simple design, the remote is especially suitable for an automobile or other vehicle.

According to another feature of the present invention, the power setting voltage is supplied to the operational amplifier by a temperature-compensating diode, which compensates for any temperature drift in the rectifier stage of the diode. For this purpose, the compensating diode is advantageously positioned sufficiently close to the diode of the rectifier stage so that both diodes are subject to the same temperature influences. In particular, when an integrated circuit design is used for the radio transmitter, both diodes are on a common chip surface.

According to one aspect of the present invention, the amplifier stage consists of a pair of bipolar transistors each having a base electrode connected to one of two signal outputs of the oscillator. The current-setting element, controlled by the operational amplifier, consists of a transistor in a current-level circuit formed of two transistors, by which the current strength in the collector-emitter current path of the two amplifier transistors, and hence their amplification and the power they deliver, can be varied. It is possible to combine the four required transistors together with the oscillator into an integrated circuit.

When using a magnetic radio-transmitting antenna, the feedback voltage signal is obtained through a feedback antenna.

In another aspect, a power setpoint voltage adjusting unit sets several different power setpoint voltage values so that, depending on the requirement, different transmitting powers of the radio transmitter can be selected.

ASK or AM modulation can be provided by a corresponding ASK or AM modulation unit which generates a corresponding modulation signal for the power setpoint voltage.

Other objects, advantages and novel features of the present invention will become apparent from the following detailed description of the invention when considered in conjunction with the accompanying drawings.

DETAILED DESCRIPTION OF THE PREFERRED EMBODIMENT

Figure 1:
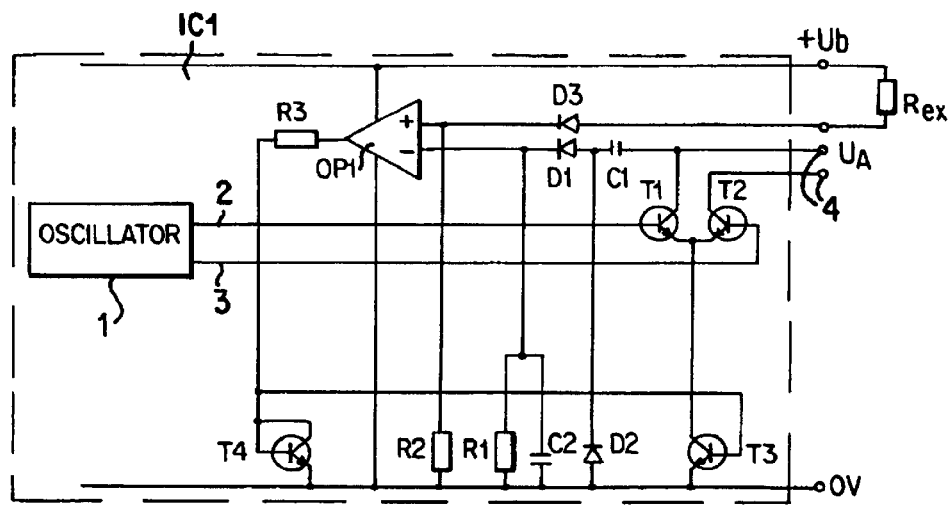
FIG. 1 is a circuit diagram of a remote for an automobile with transmitting power regulation and fully integrated design.

FIG. 1 shows a circuit diagram of a portable remote radio transmitter for an automobile. The remote includes an oscillator 1 as a voltage signal generator with two outputs 2, 3, a power-regulatable amplifier stage, in the form of two bipolar transistors T1, T2 with connected emitter terminals, a power-regulating circuit that includes an operational amplifier OP1, with inverting and non-inverting input, and a current level circuit formed by two bipolar transistors T3, T4, as well as a rectifier stage wired, upstream of the inverting operational amplifier input.

The base electrodes of the two amplifier transistors T1, T2 are each connected with the oscillator outputs 2, 3. Their common emitter connection is coupled to ground (0V) through the collector-emitter section of one current level transistor T3, while two collector terminals provide the amplified oscillator output voltage as antenna high frequency voltage $U_A$ to supply the antenna, not shown, through corresponding antenna terminals 4.

The current level transistor T3, in the emitter current path of amplifier transistors T1, T2, like the other current level transistor T4, receives, at its base, the operational amplifier output signal passing through a resistor R3. The amplifier output signal is also applied to the collector of the transistor T4, while the emitter of T4 is connected to ground.

The high frequency voltage signal output of the collector of amplifier transistor T1 forms a feedback voltage signal supplied to the rectifier stage through capacitor C1. Capacitor C1 is connected in parallel with a first diode D1 leading to the inverting operational amplifier input and opposite a second diode D2 that leads to ground. The inverting operational amplifier input is also connected to ground through a parallel circuit consisting of a resistor R1 and a second capacitor C2. The two diodes D1, D2, the second capacitor C2, and the resistor R1 thus form a rectifier stage that provides a DC voltage that is largely proportional to the antenna high-frequency voltage $U_A$ at the inverting operational amplifier input. This DC voltage is compared, by operational amplifier OP1, with a power-setting reference voltage, developed through a voltage divider, consisting of an external specifying resistor $R_{ex}$ and an internal voltage divider resistor R2 with an additional temperature compensation diode D3 from a supply DC voltage +Ub. The operational amplifier OP1 is connected through corresponding supply terminals to ground and to the positive supply voltage +Ub.

With the exception of the external setting resistance $R_{ex}$, all the above-discussed circuit components are in the form of an integrated circuit IC1, indicated by dotted lines, which can be accommodated in limited space in the housing of an electronic vehicle key. Since setting resistor $R_{ex}$ is located externally, in other words, outside the integrated circuit IC1, a desired reference voltage and hence a desired setpoint for the antenna transmitting power can be specified as needed by connecting a setting resistor $R_{ex}$ with a corresponding resistance without requiring a modified integrated circuit.

When this vehicle remote is used, the transmitting power can be adapted to different situations in different countries by attaching a suitable power setting resistor $R_{ex}$. Otherwise, the same circuit design, and especially the same integrated circuit IC1, can be used for all remotes. Due to the possibility of adjusting the transmitting power by means of the external setting resistor $R_{ex}$ in the desired fashion and keeping the desired setpoint with the power-regulating circuit, there is no need to exclude remotes that have considerable fluctuations in the transmitting power because of manufacturing tolerances, i.e. those with a higher and lower transmitting power. In addition, assurance can be provided that all remotes that work for a vehicle have the same transmitting power and hence the same range so that no undesired range fluctuations result between different keys.

The power-regulating circuit with the operational amplifier OP1 serves to maintain the desired setpoint for the antenna high-frequency voltage $U_A$ and hence for the antenna transmitting power. As soon as a fluctuation occurs, the value of the feedback DC voltage supplied from the antenna high-frequency voltage $U_A$ differs at the inverting operational amplifier input from the reference voltage applied to the non-inverting operational amplifier input. Operational amplifier OP1 reacts to this by a providing an output signal which, depending on the direction of the variation, leads to a greater or lesser current flow through current level transistor T4 which results in a corresponding change in current in the other current level transistor T3. Since the steepness characteristics of the bipolar amplifier transistors T1, T2 on the one hand determines their amplification and is approximately proportional to the collector current, the change in current strength caused by the current level leads to a corresponding change in the amplification of amplifier transistors T1, T2 which counteracts the voltage fluctuation, so that the fluctuation in the antenna high-frequency voltage $U_A$ and hence the antenna transmitting power is corrected.

The temperature-compensating diode D3 upstream of the non-inverting operational amplifier input compensates for the temperature behavior of the diode D1 located upstream of the inverting operational amplifier input. As the temperature rises, the amount of voltage drop at the rectifying diode D1 is reduced so that the feedback DC voltage applied to the inverting operational amplifier input increases. While the temperature-compensating diode D3 upstream of the non-inverting operational amplifier input shows the same temperature behavior, the reference voltage also changes to the same degree as a function of temperature, so that a temperature-based incorrect behavior of the power-regulating circuit is avoided. Of course, the temperature-compensating diode D3 is located so that it is in fact subjected to the same temperature influence as rectifying diode D1. This is ensured, for example, by locating the temperature-compensating diode D3 in the vicinity of rectifying diode D1 on a common chip surface of integrated circuit IC1.

Figure 2:
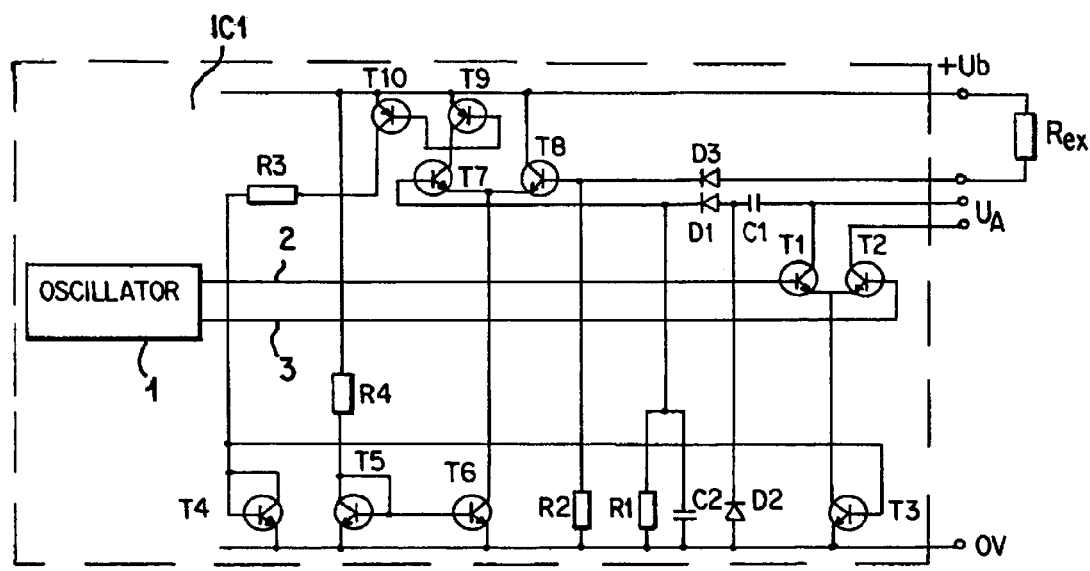
FIG. 2 is a circuit diagram with a specific implementation of a power-regulating operational amplifier.

FIG. 2 shows the remote circuit of FIG. 1 with an example of a specific construction of the operational amplifier which includes transistors T5 to T10 a resistor R4. The type and arrangement of the six bipolar transistors T5 to T10 used for the operational amplifier is shown directly in this figure, and is well known to those individuals skilled in the art, who will readily recognize the function of an operational amplifier used in this way. The circuit in FIG. 2 is otherwise identical to that in FIG. 1, so that the descriptions of FIG. 1 can be referred to.

Figure 3:
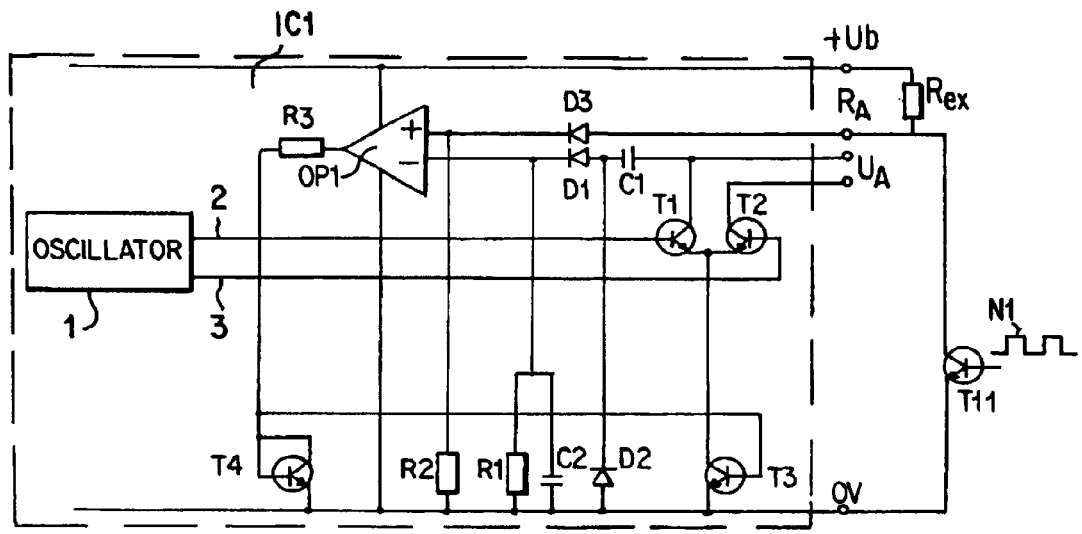
FIG. 3 is a circuit diagram of the radio transmitter with an ASK modulation function.

FIG. 3 shows a circuit diagram of a radio transmitter modified to include an ASK (amplitude shift keying) modulation unit, i.e. amplitude shift modulation unit, which makes ASK modulation possible with full maintenance of power regulation. The additionally provided ASK modulation unit consists of an additional external bipolar transistor T11 whose base electrode is capable of being subjected to a low frequency modulation signal N1. The collector-emitter lead of T11 is looped between the ground and the reference voltage terminal $R_A$ of integrated circuit IC1. The power setting resistor $R_{ex}$ is connected between the supplied DC voltage +Ub and the reference voltage terminal $R_A$. In the FIG. 3 remote, the specified resistance $R_{ex}$ of the reference DC voltage component, and hence the signal amplitude of the antenna high frequency voltage $U_A$ specifies the antenna transmitting power. This reference DC voltage component is modulated by the additional external modulation transistor T11 with the desired ASK modulation which, in turn, leads to a corresponding modulation of the amplification of the two amplifier transistors T1 and T2.

Figure 4:
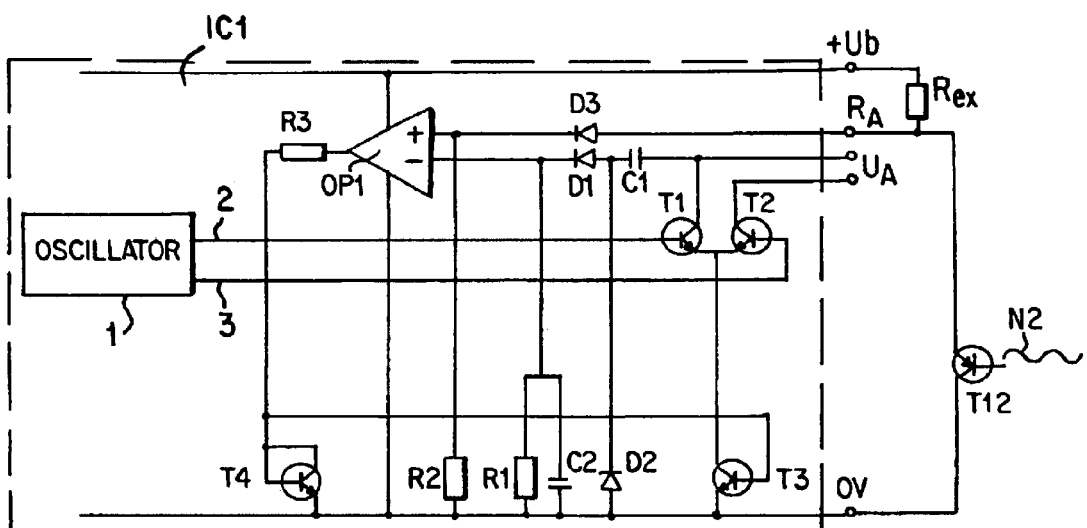
FIG. 4 is a circuit diagram of the radio transmitter with a linear AM modulation function.

FIG. 4 shows the circuit diagram of a radio transmitter provided with a modulation unit designed for producing linear AM modulation, i.e. linear amplitude modulation. For this purpose, the modulation unit in FIG. 4 has a modulating bipolar transistor T12 of the pnp type with collector connected to ground and emitter connected to reference voltage terminal $R_A$. The base of modulation transistor T12 can be subjected to a desired low frequency modulation signal N2.

The radio transmitter, designed according to FIG. 4 allows linear AM modulation for transmitting, for example, speech and music with a regulated antenna transmitting power with high linearity resulting from the power-regulating circuit. The power-regulating circuit ensures that the antenna high-frequency voltage $U_A$, at the output of amplifier transistors T1, T2, is exactly proportional to the modulated low-frequency alternating voltage at reference voltage terminal $R_A$.

Figure 5:
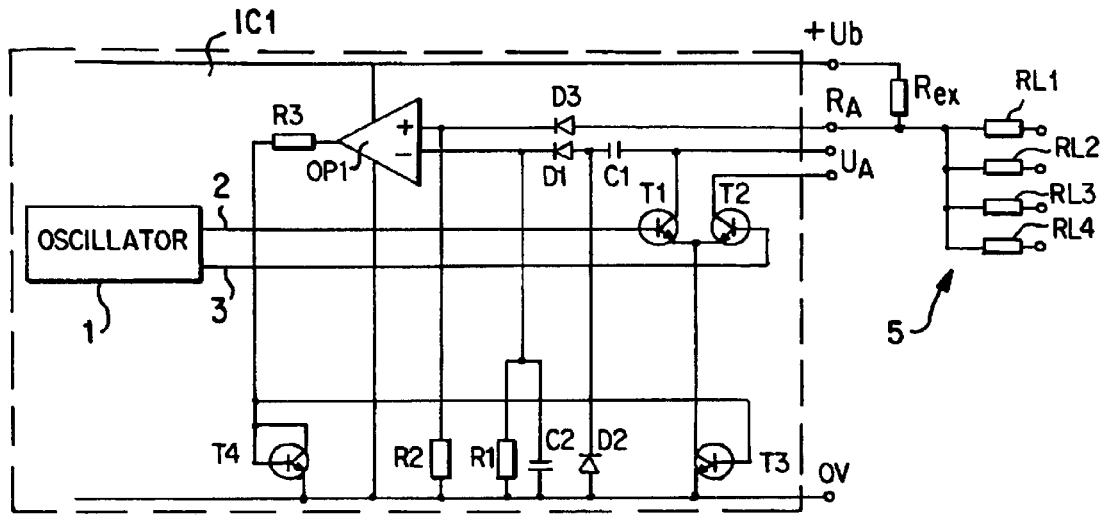
FIG. 5 is a circuit diagram of the radio transmitter with multistage adjustable transmitting power.

FIG. 5 shows the circuit of a radio transmitter with antenna transmitting power that can be changed in multiple stages. For this purpose, in addition to the radio transmitter circuit in FIGS. 1 and 2, a power-setting voltage adjusting unit 5 is provided. Unit 5 includes a plurality of resistances RL1, RL2, RL3, and RL4 in parallel and a processor unit (not shown) with which the parallel resistances RL1 to RL4 can be activated in any combination. The activation or deactivation of resistors RL1 to RL4 indicates the closure or interruption of the connection of its processor terminal with ground, while resistances RL1 to RL4 are connected to reference voltage terminal $R_A$. The active resistances thus form a voltage divider arrangement with the power setting resistance $R_{ex}$, located between reference voltage terminal $R_A$ and the supply voltage +Ub, and the internal resistance R2. With the use of four resistances RL1 to RL4, that can be activated by the processor, 16 different reference voltages and hence antenna transmitting powers can be set. When a vehicle remote is used, this offers, for example, the possibility of estimating the distance from the user, operating the remote, to the vehicle and/or to keep the transmitter range, for opening a vehicle locking arrangement through the remote, lower than the range for locking the addition, it is also very simple to perform convenient locking with a reduced range.

Figure 6:
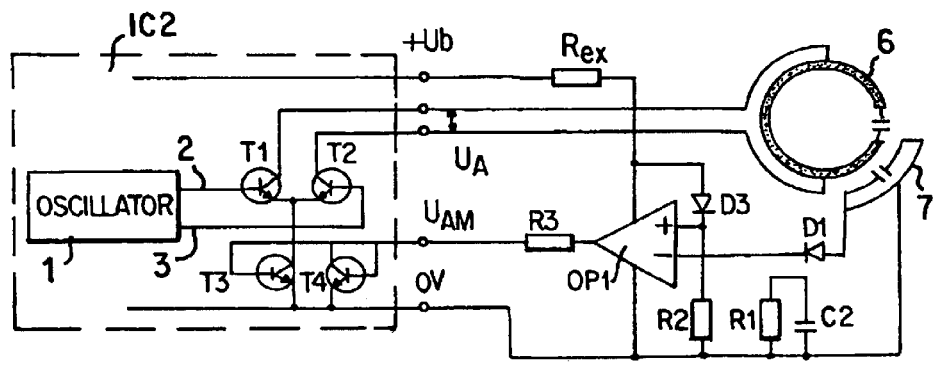
FIG. 6 is a circuit diagram of the radio transmitter with partially integrated design and with antenna feedback.

FIG. 6 shows a circuit of a radio transmitter in which the feedback voltage signal is not, as in the radio transmitters described previously, tapped from the output signal of one of the amplifier transistors T1, T2, but from the antenna signal emitted. To the extent that the radio transmitter in FIG. 6 corresponds in circuit design to that in FIGS. 1 and 2, the same reference numbers are used for the components and reference is therefore made to the description above of FIGS. 1 and 2. In particular, the antenna high-frequency voltage $U_A$ is again provided from oscillator 1 through the two amplifier transistors T1 and T2 to a magnetic antenna 6. The power-regulating circuit with the operational amplifier OP1 and the current levels T3, T4 controlled by the operational amplifier output signal through a resistor R3 correspond to FIGS. 1 and 2, while in this example however, only the oscillator 1, the two amplifier transistors T1, T2, and the two current level transistors T3, T4 are integrated into an integrated circuit IC2, while the other circuit elements are located externally. As an adjustment to the external positioning of the operational amplifier OP1, the integrated circuit IC2, in contrast to the integrated circuit IC1 in FIGS. 1 to 5, has a current level control terminal $U_{AM}$ while there is no reference voltage terminal $R_A$.

Of course, this division of the circuit components with an externally located operational amplifier together with the rectifier stage located upstream is also possible for the radio transmitter structured as shown in FIGS. 1 to 5. The integrated circuit module IC2, according to FIG. 6, is available for this purpose. Conversely, of course, the integrated circuit module IC1 shown in FIGS. 1 to 5 for creating the radio transmitter wired according to FIG. 6 can be used as an alternative to integrated circuit IC2, so that the operational amplifier OP1, together with the upstream rectifier stage, is contained in the integrated circuit.

The rectifier stage includes the first diode D1, located upstream of the inverting operational amplifier input, and the parallel circuit, which includes capacitor C2 and resistors R1, located between ground and the inverting operational amplifier input. To provide the reference voltage to the non-inverting operational amplifier input, the voltage divider is provided with the power setting resistor $R_{ex}$, the temperature-compensation diode D3, and the additional voltage divider resistor R2 located likewise externally in the circuit in FIG. 6, between ground and the positive supply voltage. Temperature compensation diode D3, which in this case like the rectifying diode D1, is located outside the integrated circuit TC2, is located so that it is subject to the same temperature influences as the rectifying diode D1, in order to provide temperature compensation.

The feedback-voltage signal supplied for power regulation of the rectifier stage is supplied by the radio transmitter, in FIG. 6, using a feedback antenna 7, which is in the magnetic operating circuit of transmitting antenna 6 to enable sampling of transmitted power. The feedback antenna 7 contains, in integrated form, the capacitor C1 on the input side and the second diode D2 of the rectifier stages in the circuits of FIGS. 1 to 5.

The above explanation of preferred embodiments makes it clear that the portable radio transmitter according to the invention, with relatively few components, is simple and compact in design and therefore can be designed especially as a remote for a motor vehicle. Depending on the need and the situation, more or fewer of the required circuit components can be included in an integrated circuit module. Of course, a completely discrete circuit design for the radio transmitter is also possible.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A portable radio transmitter, comprising:
   a voltage signal generator including an oscillator for generating an AC voltage signal;
   a power-adjustable amplifier circuit for amplifying said AC voltage signal to generate an amplified AC voltage signal, said amplifier circuit including at least one bipolar transistor having a base electrode connected to said oscillator;
   a power-regulating circuit including an operational amplifier having two inputs, and an output which provides a power-regulating setting signal to said at least one transistor through a current-setting element, wherein one of said two inputs is connected to a power setting voltage;
   a rectifier stage supplied with a feed back voltage signal, wherein said rectifier stage includes a pair of diodes connected in parallel, in opposite directions, with one of said diodes being connected in parallel with a combination of a capacitor and a first resistor and said one diode also being coupled to another one of said two inputs of said operational amplifier; and a radio-transmitting antenna receiving said amplified AC voltage signal.

2. The portable radio transmitter according to claim 1, wherein the power setting voltage is supplied to said operational amplifier (OP1) through a temperature-compensating diode (D3).

3. The portable radio transmitter according to claim 1, wherein the current-setting element is formed by a third transistor (T3) and wherein the output of said operational amplifier controls the current level of said third transistor and of a fourth transistor.

4. The portable radio transmitter according to claim 3, wherein at least the oscillator, the two amplifier transistors (T1, T2), and the two current level transistors (T3, T4) are contained in an integrated circuit (IC1, IC2).

5. The portable radio transmitter according to claim 1, further including a feedback antenna, positioned in the magnetic circuit of radio transmitter antenna, provided to generate the feedback voltage signal, and wherein the radio-transmitting antenna is a magnetic antenna.

6. The portable radio transmitter according to claim 1, further including a power setting voltage adjusting unit for multistage adjustment of various antenna transmitting power setpoints.

7. The portable radio transmitter according to claim 1, further including an AM or ASK modulation unit (T12, T11) for AM or ASK modulation of the power setting voltage.

8. A portable radio transmitter, comprising:
a voltage signal generator;
an amplifier stage receiving the output of said voltage signal generator;
a power regulating circuit including an operational amplifier, a current adjusting circuit, and a rectifier circuit, wherein said operational amplifier has a pair of input terminals with one of said input terminals being connected to a power-setting reference voltage and the other of said input terminals being connected to an output of said rectifier circuit and wherein said amplifier stage is controlled by an output of said operational amplifier in order to modulate fluctuations of an output of the voltage signal generator and maintain a desired value for an amplified high frequency voltage as an antenna input wherein said rectifier circuit includes a pair of parallel diodes and wherein a capacitor and a first resistor in parallel with one of said pair of diodes is coupled to one of said inputs of said operational amplifier.

9. The radio transmitter according to claim 8, wherein said amplifier stage includes a first pair of bipolar transistors, each receiving at their base, an output of said voltage signal generator.

10. The radio transmitter according to claim 9, further including a current adjusting element having a second pair of transistors receiving the output of the operational amplifier and providing a control signal to the emitters of the first pair of transistors.

11. The radio transmitter according to claim 8, wherein the power-setting reference voltage is supplied to said operational amplifier through a temperature-compensating diode.

12. The portable radio transmitter according to claim 8 further including a power setting voltage adjusting unit for multi-stage adjustment of a plurality of antenna transmitting power setpoints.

13. The portable radio transmitter according to claim 8, further including an AM or ASK modulation unit for AM or ASK modulation of the power setting reference voltage.

* * * * *